United States Patent [19]

Nakai

[11] Patent Number: 5,247,541
[45] Date of Patent: Sep. 21, 1993

[54] AUTOMATIC EQUALIZER FOR A DATA TRANSMISSION CHANNEL

[75] Inventor: Toshihisa Nakai, Tokyo, Japan

[73] Assignee: Oki Electric Industry Co., Ltd., Tokyo, Japan

[21] Appl. No.: 872,322

[22] Filed: Apr. 23, 1992

[30] Foreign Application Priority Data

May 30, 1991 [JP] Japan .................. 3-127593

[51] Int. Cl.$^5$ .......................................... H03H 07/30
[52] U.S. Cl. ........................................ 375/14; 375/12; 364/724.2
[58] Field of Search .................... 375/12, 14, 15; 364/724.19, 724.2; 333/18, 28 R

[56] References Cited

U.S. PATENT DOCUMENTS

| | | | |
|---|---|---|---|
| 3,868,603 | 2/1975 | Guidoux | 375/15 |
| 5,003,555 | 3/1991 | Bergmans | 375/12 |
| 5,097,482 | 3/1992 | Serizawa et al. | 375/12 |
| 5,119,401 | 6/1992 | Tsujimoto | 375/14 |
| 5,175,747 | 12/1992 | Murakami | 375/14 |

FOREIGN PATENT DOCUMENTS

36538 8/1983 Japan .

*Primary Examiner*—Curtis Kuntz
*Assistant Examiner*—T. Ghebretinsae
*Attorney, Agent, or Firm*—Spencer, Frank & Schneider

[57] ABSTRACT

An automatic equalizer for a data transmission channel capable of removing intersymbol interference and phase fluctuations accurately without lowering the convergence rate even when the frequency characteristic of the channel sharply changes. A summation output to be fed to a decision unit has the phase thereof so rotated as to compensate for an amount of phase fluctuation. The output of the decision unit to be applied to a feedback filter, which follows the decision unit, and an error to be applied to a tap coefficient control section each has the phase thereof rotated in such a manner as to add phase rotation in matching relation to the amount of phase rotation. Even when the tap coefficient control section is implemented with an RLS (Recursive Least Square) alogorithm, it can update tap coefficients by the same procedure with no regard to phase fluctuations.

6 Claims, 8 Drawing Sheets

AUTOMATIC EQUALIZER FOR A DATA TRANSMISSION CHANNEL

BACKGROUND OF THE INVENTION

1. Field of the Invention

The present invention relates to an automatic equalizer provided on a data transmission channel for regenerating an original waveform from digital data and, more particularly, to an automatic equalizer applicable to the reception or transiting of digital data which is transmitted at high speed over a telephone line, radio channel or similar data transmission channel.

2. Description of the Prior Art

When digital data is transmitted over a telephone line, for example, it is likely that the waveform representative of the data is sequentially distorted due to the fluctuation of a power source located at a transmitting station and/or the frequency characteristic particular to the telephone line and cannot be accurately demodulated at a receiving station. Generally, this kind of distortion is ascribable to intersymbol interference, phase jitter, and frequency offset. The intersymbol interference results from reflected waves which occur at, for example, the branching points of the transmission channel and interfere with the original waveform. The phase jitter is caused by the fluctuation of the phase of the data wave while the frequency offset is a frequency deviation appearing in the substantially constant movement of the phase of the data wave. The phase jitter and frequency offset result in the fluctuation of the phase of the received waveform. In light of this, it is a common practice to provide a receiving station and a tandem station with a demodulator having an automatic equalizer which regenerates an original waveform by removing intersymbol interference and phase fluctuation included in a received waveform.

Conventional demodulators for the above application include one having a decision feedback equalizer, as disclosed in, for example, Japanese Patent Laid-Open Publication No. 36538/1982. The decision feedback equalizer has a pair of complex transversal filters respectively assigned to the feedforward side and the feedback side of a demodulator for removing intersymbol interference. A decision section is provided between the feedforward side and the feedback side for estimating a transmitted signal. A phase control section gives a phase rotation opposite in phase to the phase fluctuation base on the output of the decision section while following phase jitter and frequency offset. A tap coefficient control section updates the tap coefficients of the complex transversal filters, as needed. Data propagated through the feedforward transversal filter is added to the output of the feedback transversal filter and then fed to the decision section. The decision section estimates a transmitted signal on the basis of a set of predetermined desired signals and feeds back the estimated signal to the feedback filter. At the same time, the decision section determins a difference between the input signal and the output signal and delivers the resulting error to the phase control section. At this instant, the error includes a fluctuation in the phase of the received signal. Having a second order PLL (Phase Locked Loop) circuit including two integrating loops, the phase control section gives a phase rotation associated with a phase jitter component of the phase fluctuation of the error by the first integration loop while giving a phase rotation associated with a frequency offset component by the second integration loop. The two phase rotation is fed to a multiplier which follows the adder for adding the outputs of the transversal filters. The multiplier multiplies the phase fluctuation of the received signal and the phase rotation opposite in phase thereto and fed from the phase control section to deliver data free from the phase fluctuation to the decision section. Since the data to be fed back to the feeback transversal filter via the decision section does not include any phase component, a multiplier is connected to the output of the feedback filter for multiplying the data by a phase output corresponding to a phase fluctuation resulted from the complex conjugate of the phase rotation output by the phase control section.

In the above construction, the feedforward transversal filter removes a distortion preceding the center peak value of a distored pulse, i.e., precursor while the feedback transversal filter removes postcursor following the center peak value of the pulse. The resulting outputs of the two filters are added together and then provided with the phase rotation from the phase control section. As a result, the received data is approximated to data estimated on the basis of a set of desired signals to thereby regenerate the transmitted signal. The tap coefficients of the transversal filters are sequentially updated by a tap coefficient control section to remove intersymbol interference associated with the received signal. The tap coefficient control section is usually constructed to update the tap coefficients by use of a particular algorithm referred to as an LMS (Least Mean Square) algorithm. Specifically, with the LMS algorithm, the control unit updates the next tap coefficients such that the square of a difference between the output of the transversal filter and an estimated signal at each decision timing becomes minimum.

However, the problem with the tap coefficient updating system using the LMS algorithm is that when the transmission channel is of the kind sharply changing the characteristic thereof, the convergence rate of the system is too slow to follow the changes in the channel characteristic. It is likely, therefore, that the conventional equalizer fails to remove both of intersymbol interference and phase fluctuation.

SUMMARY OF THE INVENTION

It is, therefore, an object of the present invention to provide an automatic equalizer which is operable with an algorithm having an inherently high convergence rate even when the characteristic of a transmission channel sharply changes, thereby surely eliminating both of intersymbol interference and phase fluctuation.

An automatic equalizer for a data transmission channel of the present invention comprises a feedforward filter for holding a received signal in a complex representation to thereby remove precursor of intersymbol interference included in the received signal, a feedback filter for holding a feedback signal fed back from an output terminal to thereby remove postcursor of intersymbol interference included in the received signal, an adder for adding an output of the feedforward filter and an output of the feedback filter to produce a sum, a first multiplier for multiplying the sum from the adder by a phase rotation opposite in phase to an amount of phase fluctuation included in the sum to thereby produce a product, a deciding section for comparing the product from the first multiplier with a set of predetermined desired signals to output an estimated signal, an error detecting section for producing an error output representative of a difference between a signal input to the deciding section and a signal output from the deciding section, a phase control section for feeding to the first multiplier a phase rotation opposite in phase to the received detected signal on the basis of the error output from the error detecting section, a conjugate computing section for computing a complex conjugate of an output of the phase control section, a second multiplier for multiplying the estimated signal from the deciding section by the signal output from the conjugate computing section and feeding the resulting product to the feedback filter, a third multiplier for multiplying the error output from the error detecting section and the signal output from the complex conjugate computing section to output the result of multiplication as an equalization error output, and a tap coefficient control section for sequentially updating tap coefficients of the feedforward filter and tap coefficients of the feedback filter in response to sampled outputs from the feedforward filter and feedback filter and the equalization error output from the third multiplier.

BRIEF DESCRIPTION OF THE DRAWINGS

The objects and features of the present invention will become more apparent from the consideration of the following detailed description taken with the accompanying drawings in which.

DESCRIPTION OF THE PREFERRED EMBODIMENT

Figure 1:
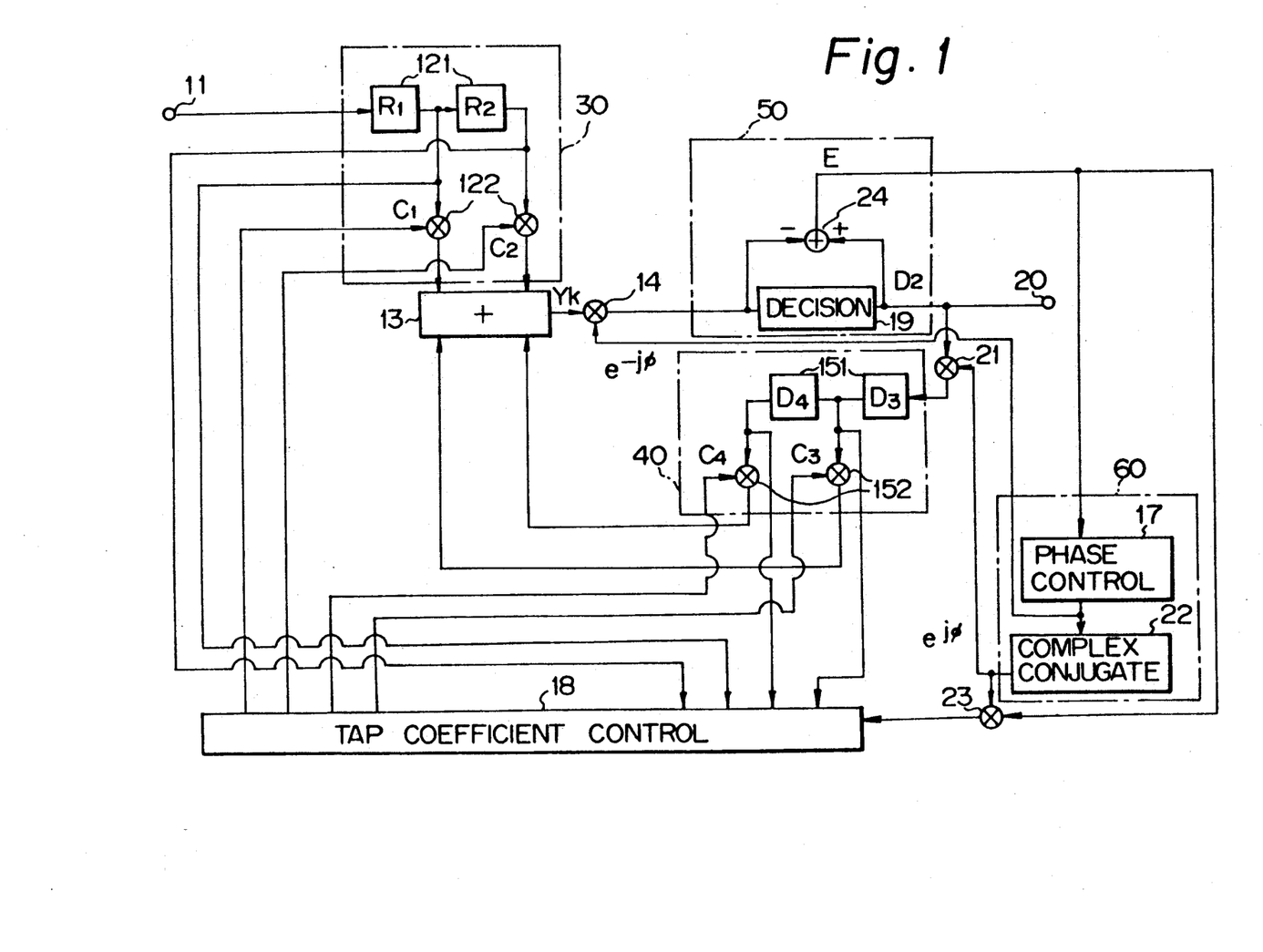
FIG. 1 is a block diagram schematically showing an automatic equalizer embodying the present invention.

Referring to FIG. 1 of the drawings, an automatic equalizer embodying the present invention is shown. Assuming that data undergone quadrature amplitude modulation (QAM) at a transmitting station is sent at a high speed to a receiving station over a telephone line or similar transmission channel or circuit, the illustrative embodiment may implement a data demodulator incorporated in the receiving station.

As shown in FIG. 1, the automatic equalizer has a feedforward filter 30 and a feedback filter 40 located at the input side and the feedback side, respectively. An adder 13 adds the outputs of the feedforward and feedback filters 30 and 40 to output the resulting sum. A first multiplier 14 gives a phase rotation to the output of the adder 13. A deciding section 50 compares the output of the first multiplier 14 with a set of predetermined desired signals to output an estimate signal while determining a difference between input and output signals. A phase detecting section 60 determines an amount of fluctuation of the phase of the input signal on the basis of the resulting error signal E from the deciding section 50 and outputs the determined amount of phase fluctuation together with a phase rotation opposite in phase thereto. A second multiplier 21 multiplies the input to the feedback filter 40 by the phase fluctuation fed thereto from the phase detecting section 60. A tap coefficient control section 18 updates the tap coefficients of the feedforward and feedback filters 30 and 40. A third multiplier 23 multiplies the error signal E from the deciding section 50 and the phase fluctuation from the phase detecting section 60 to feed the resulting product to the tap coefficient control section 18.

Specifically, an analog-to-digital (AD) converter, not shown, precedes the automatic equalizer and samples a received wave. A baseband signal in a complex representation is fed from the AD converter to the feedforward filter 30 via an input terminal 11. The feedforward filter 30 is implemented as a complex transversal filter made up of a shift register 121 and a multiplier 122. The feedfoward filter 30 holds the received signal coming in through the input terminal 11 in order to remove intersymbol interference of pulses preceding the center peak values of the pulses, i.e., so-called precursor. The shift register 121 is constituted by a series connection of a plurality of delay elements each having a tap and holds the input signal over a predetermined period of time. Although the shift register 121 is shown as having only two delay elements R1 and R2, it in practice may be made up of any number of delay elements, e.g., tens of delay elements. The first delay element R1 holds the received signal being currently fed from the input terminal 11 while the second delay element R2 holds the previous received signal i.e., the output of the delay element R1 delayed by a predetermined period of time. Both of the outputs of the delay elements R1 and R2 are applied to the tap coefficient control 18 and multiplier 122. The multiplier 122 has a plurality of multiplier elements to which the taps of the delay elements R1 and R2 are connected, as illustrated. These multiplier elements multiply respectively the outputs of the delay elements R1 and R2 by tap coefficients C1 and C2 and deliver the resulting products to the adder 13. The tap coefficients C1 and C2 are updated by the tap coefficient control section 13, as needed.

The feedback filter 40, like the feedforward filter 30, is implemented as a complex transversal filter. Specifically, it has a shift register 151 made up of a plurality of delay elements each having a tap, and a multiplier 152 made up of a plurality of multiplier elements to which the taps of the delay elements are connected. The feedback filter 40 removes intersymbol interference of pulses following the center peak values of the received signal, i.e., so-called postcursor. Again, while shift register 151 and the multiplier 152 are shown as having two delay elements D3 and D4 and two multiplier elements, respectively, they may have tens of delay elements and tens of multiplier elements in a practical arrangement. The estimated output D2 of the deciding section 19 is applied to the feedback filter 40 via a multiplier 21. Hence, the delay element D3 holds the present estimated signal from the deciding section 19 while the delay element D4 holds the previous estimated signal which is the output of the delay element D3 delayed by a predetermined period of time. Tap coefficients C3 and C4 are fed to the multiplier 152 and are updated by the tap coefficient control section 18, as needed. The multiplier elements constituting the multiplier 152 multiply respectively the outputs of the delay elements D3 and D4 by the tap coefficients C3 and C4 and feed the resulting products to the adder 13.

The adder 13 adds the outputs of the feedforward filter 30 and the outputs of the feedback filter 40 and delivers the sum to a multiplier 14. As a result, the adder 13 produces an output free from intersymbol interference which was included in the received signal. Hence, only the data including the phase fluctuation is fed to the multiplier 14. The phase detecting section 60 delivers to the multiplier 14 a phase rotation which is opposite in phase to the phase flutuation included in the output of the adder 13. Assuming that the phase fluctuation from the adder 13 is e(j$\phi$) where e, j and $\phi$ are respectively a natural logarithm, an imaginary number, and a phase component, then the phase rotation from the phase detector 60 is e($-$j$\phi$). The multiplier 14 multiplies the output of the adder 13 by the phase rotation e($-$j$\phi$) to thereby remove the phase fluctuation. The output of the multiplier 14 is applied to a decision unit 19 included in the deciding section 50. The decision unit 19 stores a predetermined estimated value at the time of, for example, a training pulse sequence executed beforehand. By using the estimated value, the decision unit 19 estimates regenerated data D2 from the output of the multiplier 14. The decision data D2 is outputted as estimated data to be transmitted via an output terminal 20 and, at the same time, fed to the feedback filter 40 via the multiplier 21, as stated earlier.

A subtractor 24 is also included in the deciding section 50 for performing complex subtraction of the output data from the decision unit 19 from the input data to the decision unit 19. The subtractor 24 produces an output error E corresponding to the phase fluctuation included in the data input thereto, i.e., the output of multiplier 14. The output error E is delivered to a phase control unit 17 built in the phase detecting section 60. The phase control unit 17 is constituted by a detector having, for example, the second order PLL (Phase Locked Loop) including two integrating circuits. The phase control unit 17 detects a phase jitter component out of the phase error E by a first integration loop and detects a frequency offset component out of the phase error E by a second integration loop. The phase jitter component and frequency offset component so detected are delivered to the multiplier 14 and a complex conjugate unit 22 incorporated in the phase detecting section 60 as the phase rotation e($-$j$\phi$) opposite in phase to the phase fluctuation e(j$\phi$). The complex conjugate unit 22 calculates the complex conjugate e(j$\phi$) of the phase rotation e($-$j$\phi$) applied thereto from the phase control unit 17 and feeds a value equal to e(j$\phi$) to the multipliers 21 and 23. The multiplier 23 multiplies the output error E from the subtractor 24 by the output e(j$\phi$) of the complex conjugate unit 22 and delivers the resulting product to the tap coefficient control section 18 as an equalization error signal E($\phi$)=E*e(j$\phi$) where the asterisk indicates multiply.

The tap coefficient control unit 18 receives the contents R1 and R2 of the shift register 121 included in the feedforward filter 30, the contents D3 and D4 of the shift register 151 included in the feedback filter 40, and the equalization error signal E($\phi$)=E*e(j$\phi$) from the multiplier 23, as stated above. In response, the tap coefficient control unit 18 outputs tap coefficients C1, C2, C3 and C4 by calculations using a tap coefficient updating algorithm. In the embodiment, when the transmission channel is of the kind sharply changing the characteristic thereof, the tap coefficient updating algorithm is often implemented by an RLS (Recursive Least Square) algorithm. With the RLS algorithm, the tap coefficient control section 18 produces next tap coefficients C1'-C4' from the present tap coefficients C1-C4 by using equations (1)-(3), as follows.

Next tap coefficients C1'-C4' are respectively the sums of the present tap coefficients C1-C4 and the products of the output E ($\phi$) of the multiplier 23 and weights [Q], as represented by the following equation:

$$[C'] = [C] + [Q] * E(\phi) \quad (1)$$

where $$[C'] = \begin{bmatrix} C1' \\ C2' \\ C3' \\ C4' \end{bmatrix}, [C] = \begin{bmatrix} C1 \\ C2 \\ C3 \\ C4 \end{bmatrix},$$

$$[Q] = \begin{bmatrix} Q1 \\ Q2 \\ Q3 \\ Q4 \end{bmatrix}, E(\phi) = E * (j\phi)$$

The weights Q1-Q4 are obtainable from weighting coefficients [P] having initial values usually in a 4×4 unit matrix weighted by 100 order, the detection outputs R1 and R2 from the filter 30 and the decision outputs D3 and D4 from the filter 40, and their complex conjugate numbers #R1, #R2, #D3 and #D4, as follows:

$$[Q] = \{[P] * [\#R, \#D]\}/\{\lambda + [R, D]t * [P] * [\#R, \#D]\} \quad (2)$$

where $$[P] = \begin{bmatrix} P_{11}, & P_{12}, & P_{13}, & P_{14} \\ P_{21}, & P_{22}, & P_{23}, & P_{24} \\ P_{31}, & P_{32}, & P_{33}, & P_{34} \\ P_{41}, & P_{42}, & P_{43}, & P_{44} \end{bmatrix}, [\#R, \#D] \equiv \begin{bmatrix} \#R1 \\ \#R2 \\ \#D3 \\ \#D4 \end{bmatrix}$$

$\lambda$ is a coefficient referred to as a fogetting factor, and [R, D] t is a transposed matrix of [R, D], i.e., a 4-row 1-column matrix transposing a 1-column 4-row matrix.

Further, next coefficients [P'] are sequentially produced from the previous coefficients [P], the outputs [R, D] of the filters 30 and 40, and weights [Q] by an equation:

$$[P']=\{[P]-[Q]*[R, D]t * [P]\}/\lambda \quad (3).$$

Figure 2:
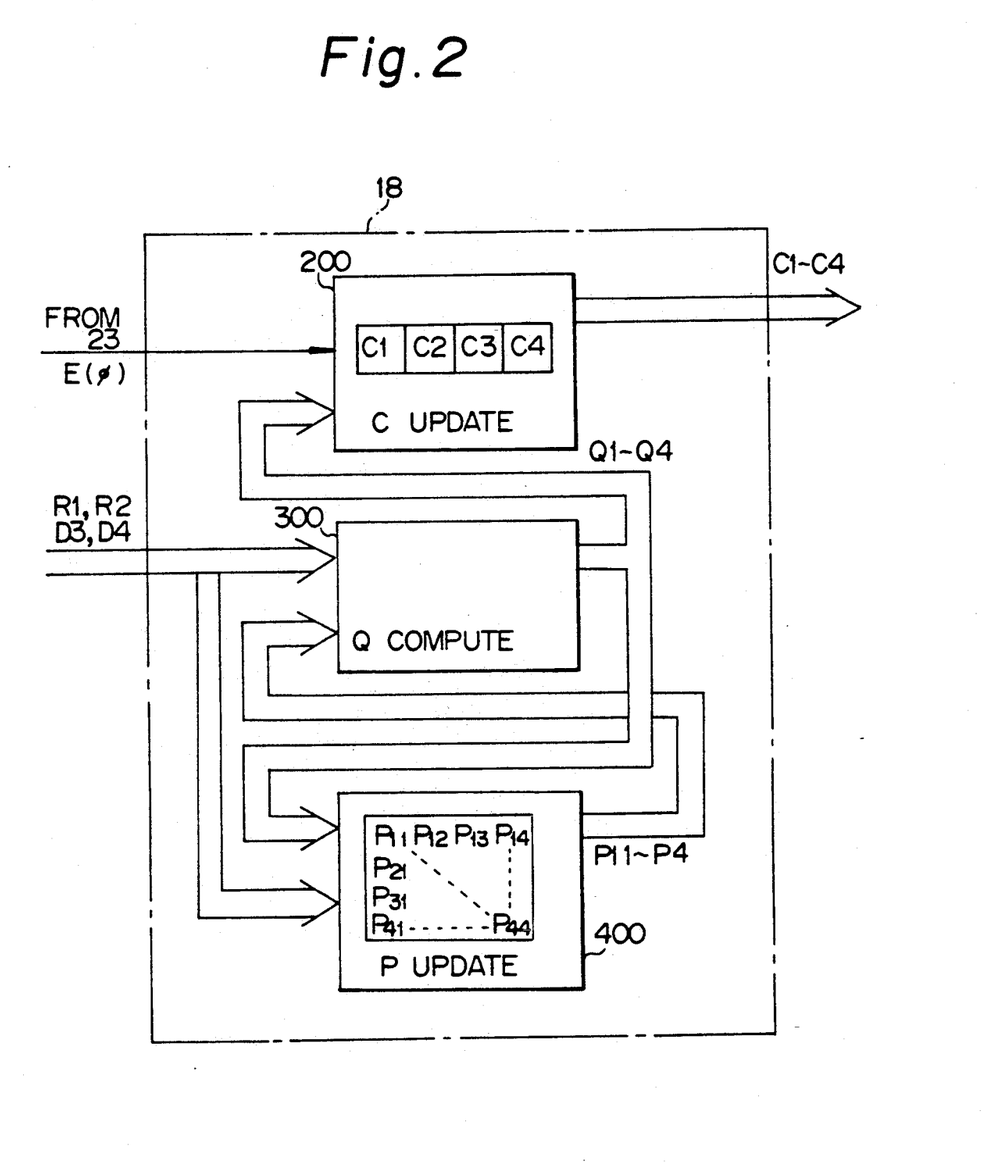
FIG. 2 is a block diagram schematically showing a specific construction of a tap coefficient control section included in the embodiment.
Figure 3:
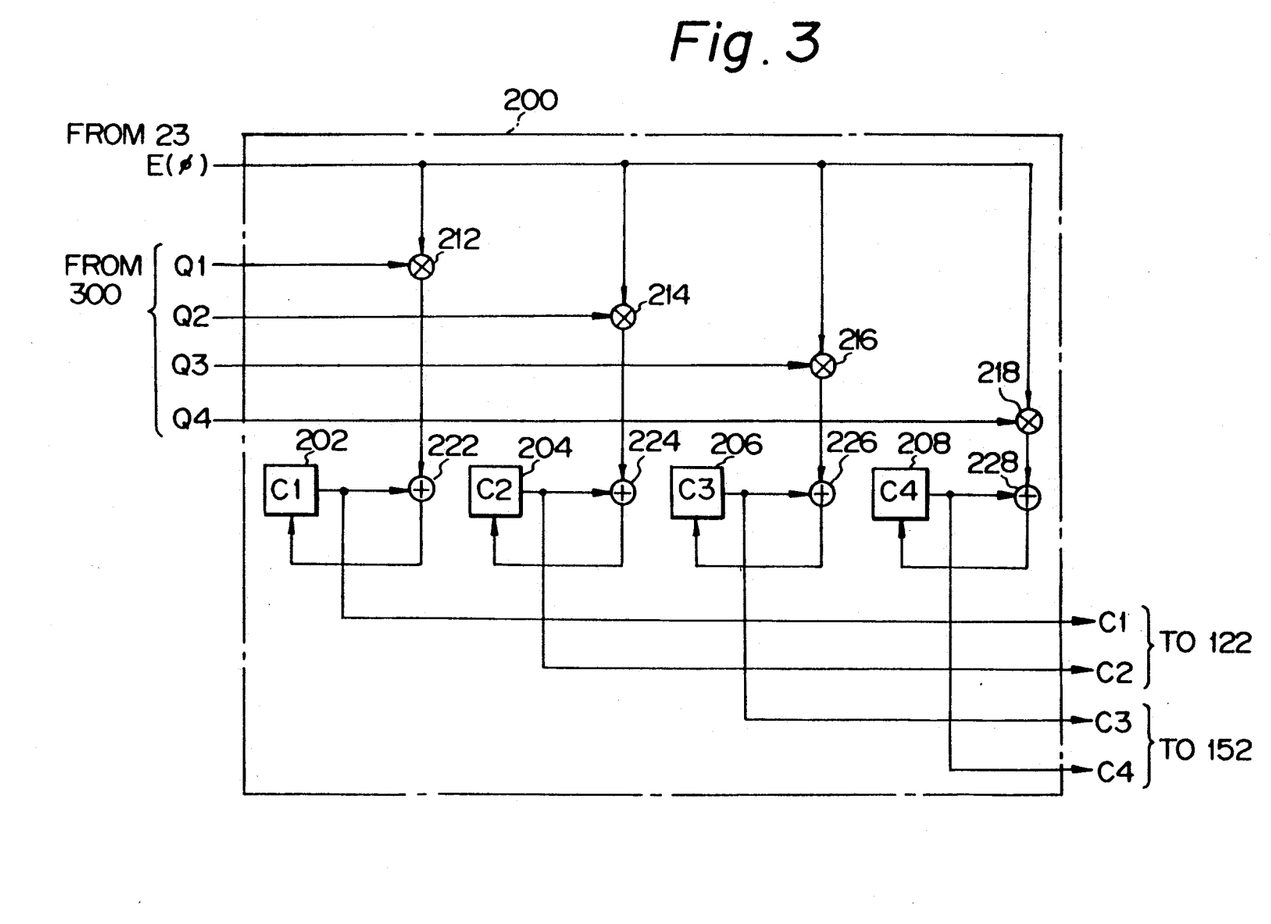
FIG. 3 is a block diagram schematically showing a specific construction of a tap coefficient updating block included in the tap coefficient control section of FIG. 2.

A reference will be made to FIGS. 2-8 for describing the tap coefficient control section 18 using the RLS algorithm represented by the above equations (1)-(3). As shown in FIG. 2, the tap coefficient control section 18 is generally made up of a C updating block 200, a Q computing block 300, and a P updating block 400. The C updating block 200 receives a phase output E ($\phi$) from the multiplier 23 and weights Q1-Q4 from the Q computing block 300 so as compute tap coefficients C1-C4 by using the equation (1). As shown in FIG. 3 specifically, the C updating block 200 has registers 202-208 for storing respectively the tap coefficients C1-C4, multipliers 212-218 for multiplying respectively the output error E ($\phi$) and the weights Q1-Q4, and adders 222-228 for adding respectively the outputs of the adders 212-218 and the previous tap coefficients stored in the registers 202-208. The outputs of the adders 222-228 are respectively updated at the registers 202-208, as needed. The tap coefficients C1 and C2 and the tap coefficients C3 and C4 are delivered to the multipliers 122 and 152 of the transversal filters 30 and 40, respectively.

Figure 4:
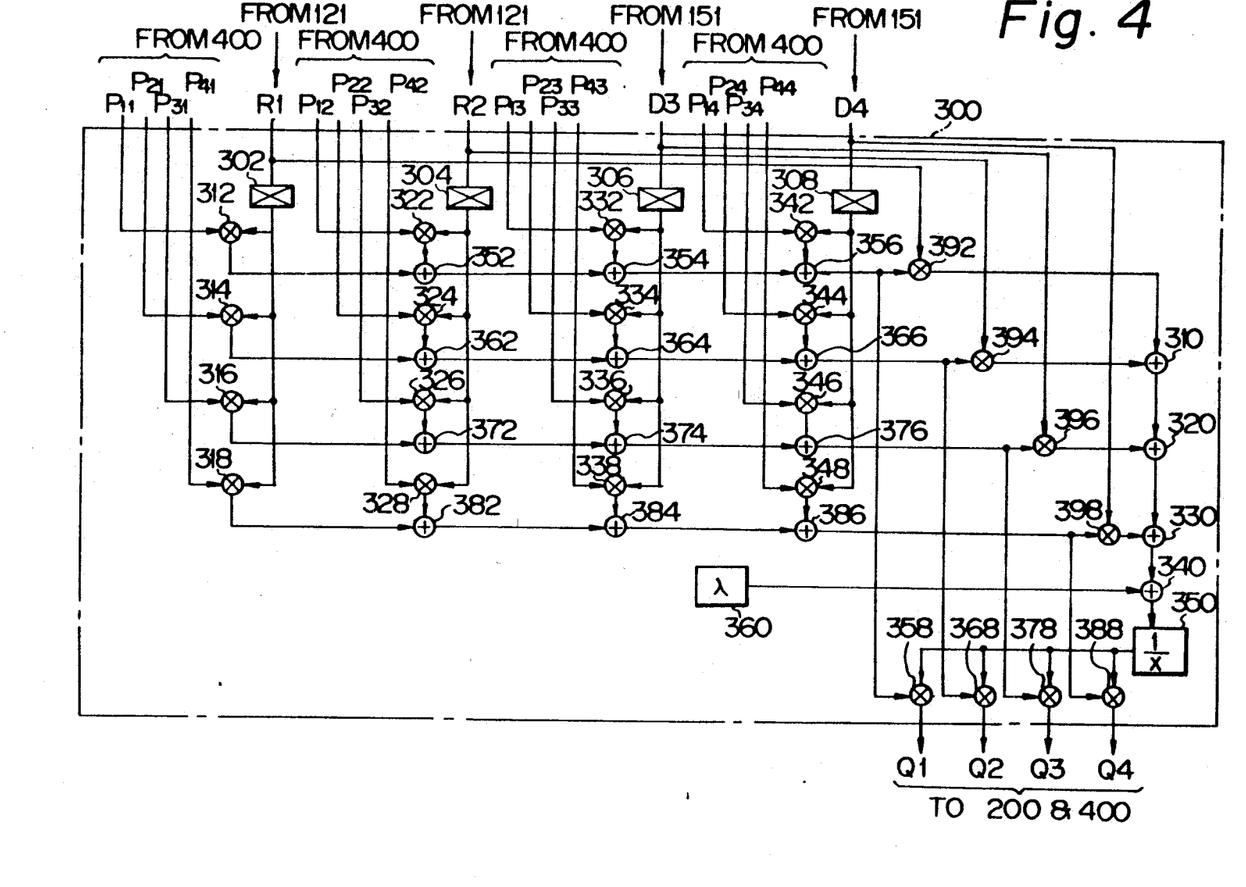
FIG. 4 is a block diagram showing a specific construction of a Q computing block also included in the tap coefficient control section.

The Q computing block 300 receives detection outputs R1 and R2 from the transversal filter 30, decision outputs D3 and D4 from the transversal filter 40, and coefficients P11-P44 from the P updating block 400 and in turn computes weights Q1-Q4 by using the equation (2). As shown in FIG. 4 specifically, the Q computing block 300 has complex conjugate units 302-308. The complex conjugate units 302-308 receive respectively filter outputs R1, R2, D3 and D4 each being represented by a complex number and in turn output respectively complex conjugate numbers #R1, #R2, #D3 and #D4 of the filter outputs. The outputs of the complex conjugate units 302-308 are applied to multipliers 312-318, multipliers 322-328, multipliers 332-338, and multipliers 342-348, respectively. The multipliers 312-318 multiply respectively the output #R1 of the complex conjugate unit 302 and the weighting coefficients P11-P14 on the first row of the matrix [P]. Likewise, the multipliers 322-328 multiply respectively the output #R2 of the complex conjugate unit 304 and the weighting coefficients P12-P42 on the second row of the matrix [P]. Further, the multipliers 332-338 multiply respectively the output #D3 of the complex conjugate unit 306 and the weighting coefficients P13-P43 on the third row of the matrix [P], while the multipliers 342-348 multiply respectively the output #D4 of the complex conjugate unit 308 and the weighting coefficients P14-P44 on the fourth row of the matrix [P]. The outputs of the multipliers 312-348 are applied to adders 352-386. The adders 352, 354 and 356 sequentially add the outputs of the multipliers 312, 322, 332 and 342 to compute the first row and deliver the result of computation to a multiplier 392. The adders 362, 364 and 366 sequentially add the outputs of the multipliers 314, 324, 334 and 344 to compute the second row and feeds the result to a multiplier 394. The adders 372, 374 and 376 sequentially add the outputs of the multipliers 316, 326, 336 and 338 to compute the third row and apply the result to a multiplier 396. Further, the adders 382, 384 and 386 sequentially add the outputs of the multipliers 318, 328, 338 and 348 to compute the fourth row and deliver the result to a multiplier 398.

On receiving the result of computation on the first row from the adder 356, the multiplier 392 multiplies it and the output R1 of the filter 30. On receiving the result of computation on the second row from adder 366, the multiplier 394 multiplies it and the output R2 of the filter 30. On receiving the result of computation on the third row from the adder 376, the multiplier 396 multiplies it and the decision output D3 of the filter 40. On receiving the result of computation on the fourth row from the adder 386, the multiplier 398 multiplies it by the decision output D4 of the filter 40. The outputs of the multipliers 392-398 are sequentially added by adders 310, 320 and 330. Further, an adder 340 adds the forgetting factor $\lambda$ to the output of the adder 330 and applies the resulting sum to a reciprocal computing unit 350. The forgetting factor $\lambda$ is stored in a register 360. The output of the reciprocal computing unit 350 is representative of the denominator of the equation (2) and fed to multipliers 358, 368, 378 and 388. The multipliers 358-388 each multiplies the output of the reciprocal computing unit 350 and one of the outputs of the adders 356-386 each being associated with one row. The outputs of the multipliers 358-388, i.e., weights Q1-Q4 meant for the tap coefficients are fed out to the C updating block 200 and P updating block 400.

Figure 5:
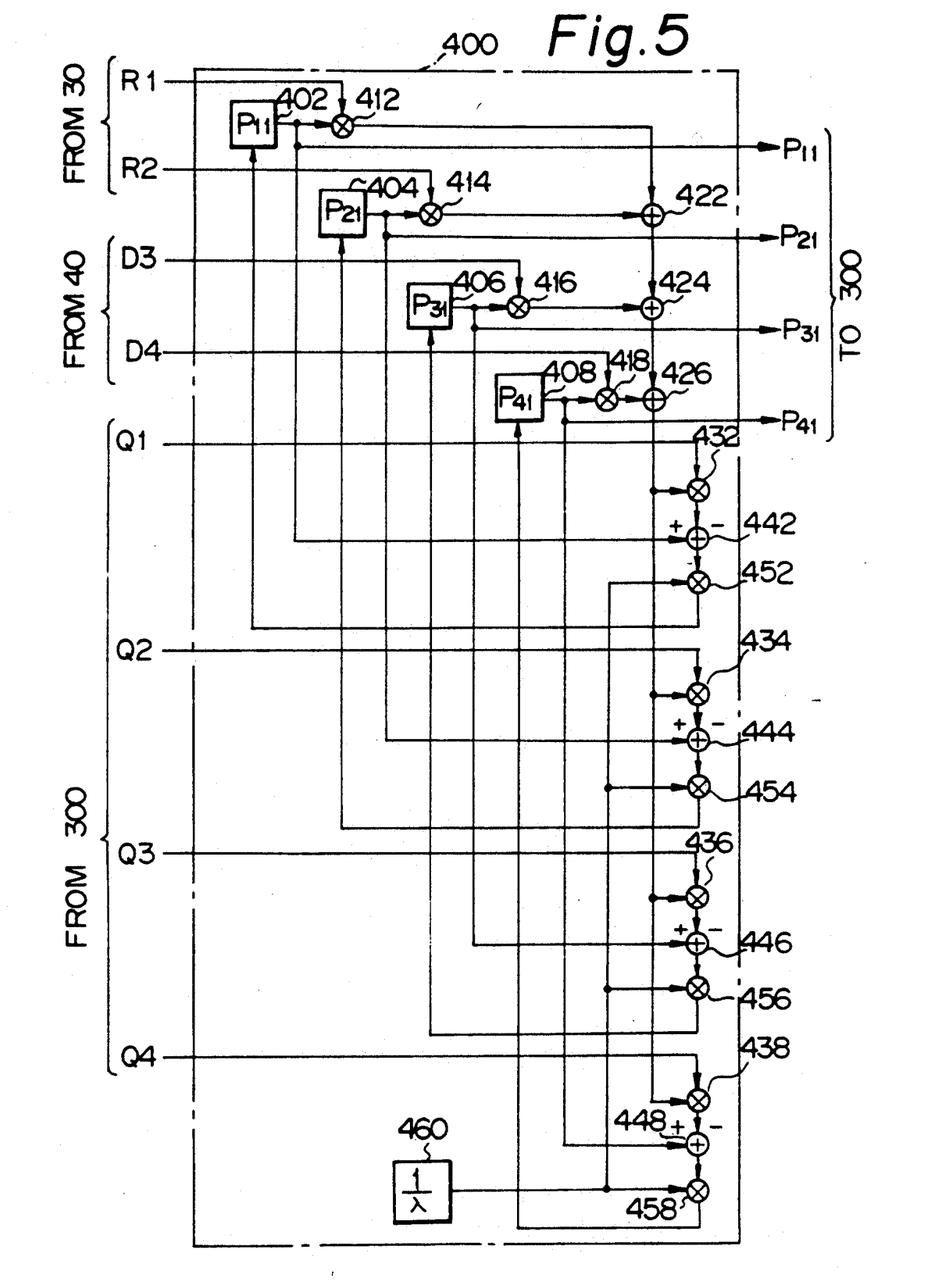
FIGS. 5-8 are block diagrams each schematically showing a specific construction of particular part of a P updating block further included in the tap coefficient control section.
Figure 6:
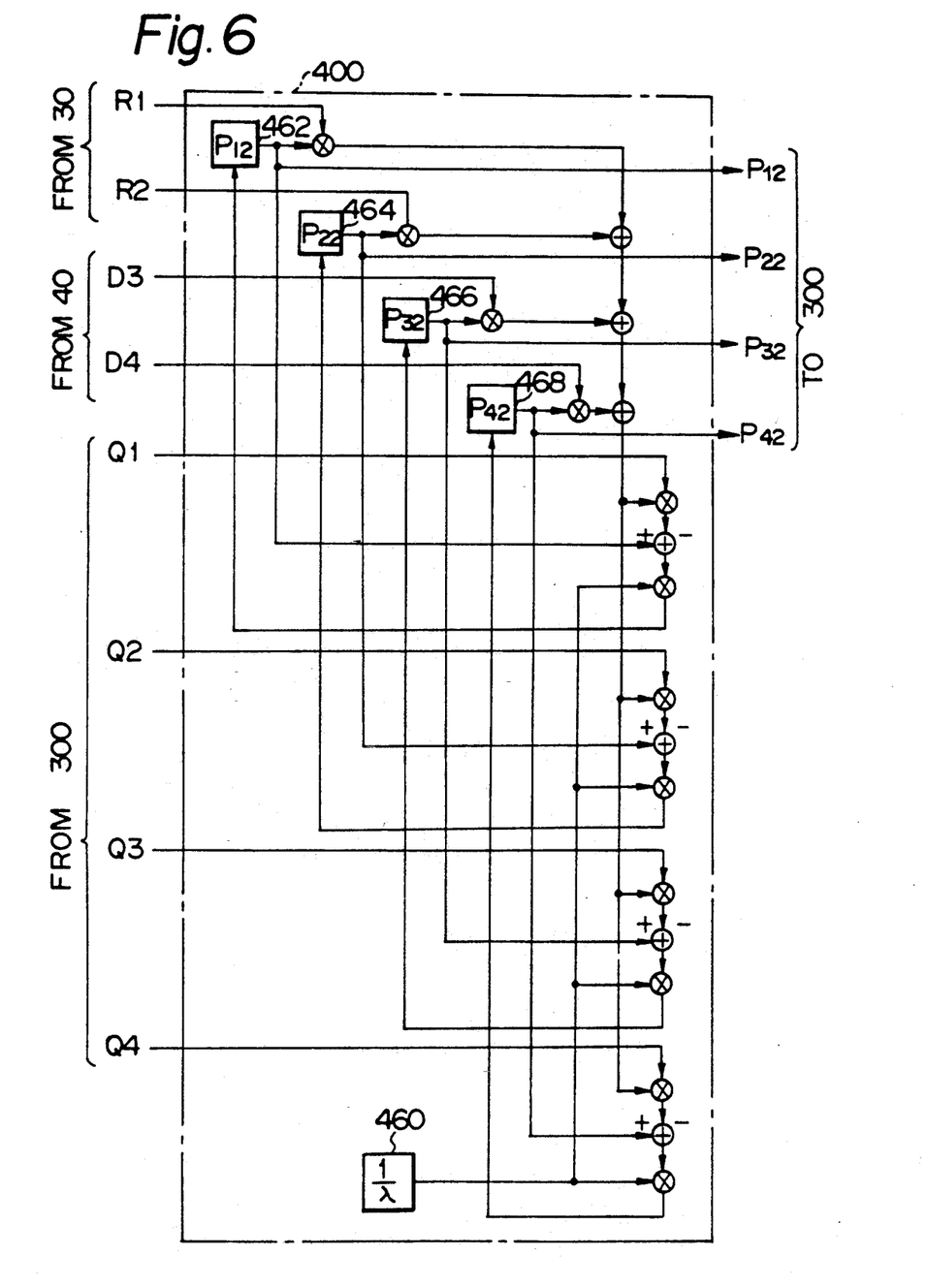
Figure 7:
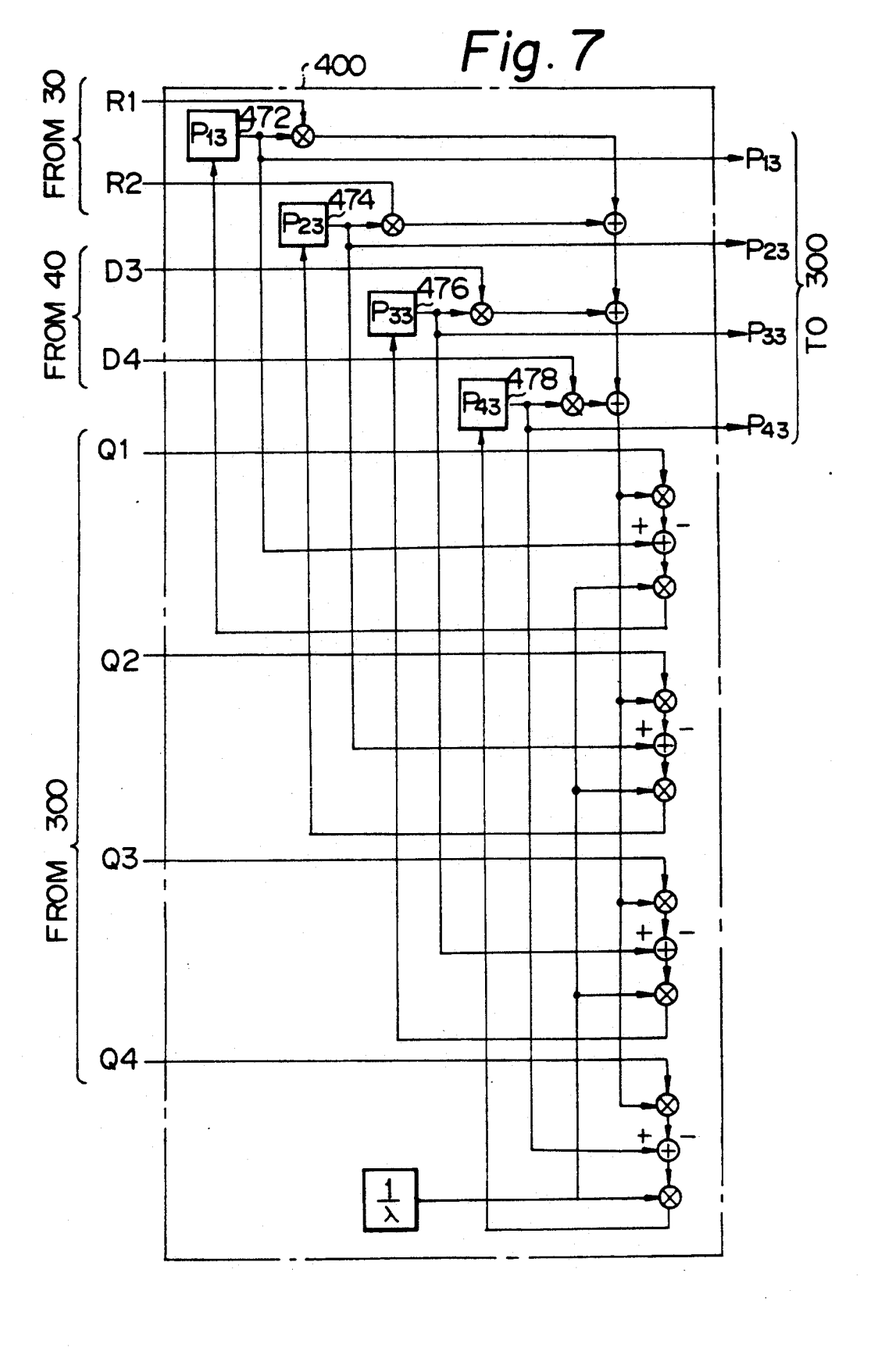
Figure 8:
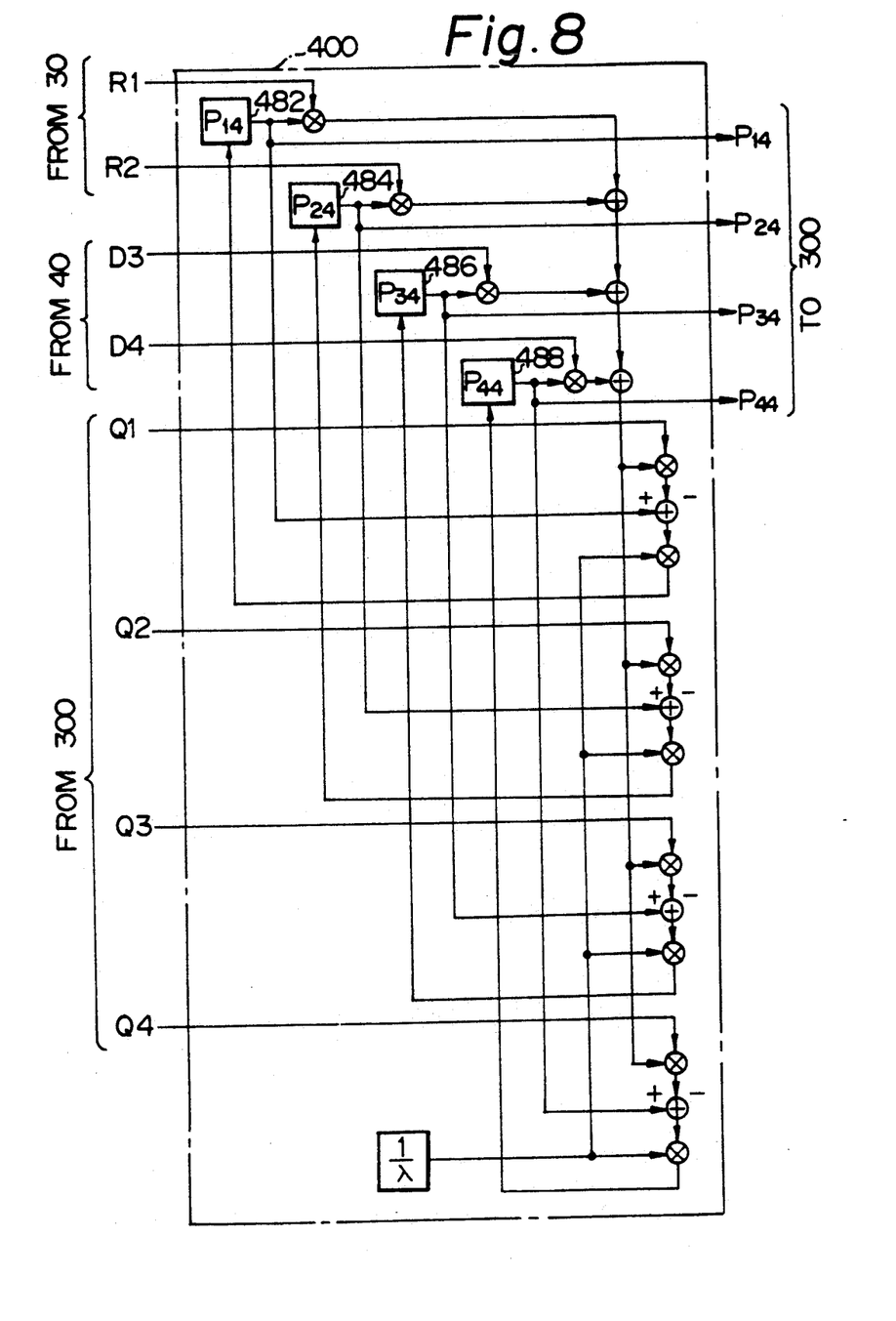

The P updating block 400 receive the weights Q1-Q4 from the Q computing block, detection outputs R1 and R2 from the filter 30, and decision outputs D3 and D4 from the filters 40 and in turn updates the 4×4 weighting coefficient matrix, i.e., weighting coefficients P11-P44. FIGS. 5-8 show a specific construction of the P updating block 400. Specifically, FIGS. 5-8 each shows respective one of functional sections which compute the coefficients of the respective columns. Let the following description concentrate on the functional section of FIG. 5 assigned to the first row P11-P41 of the matrix by way of example. In FIG. 5, registers 402-408 store the weighting coefficients P11-P41, respectively. Multipliers 412-418 multiply respectively the outputs of the registers 402-408 and the outputs R1, R2, D3 and D4 of the filters 30 and 40. Adders 422-426 sequentially add the outputs of the multipliers 412-418. Multipliers 432-438 multiply respectively the outputs of the adders 426 and the weights Q1-Q4 of the tap coefficients. Subtractors 442-448 subtract respectively the outputs of the multipliers 432-438 from the outputs of the registers 402-408. Multipliers 452-458 multiply respectively the outputs of the subtractors 442-448 and the reciprocal of the forgetting factor $\lambda$. The reciprocal of the forgetting factor $\lambda$ is stored in a register 460. The outputs of the multipliers 452-458 are respectively update at the registers 402-408 and then delivered to the Q computing block 300 as weighting coefficients P11-P41. FIGS. 6, 7 and 8 show respectively functional sections for updating the second row P12-P42, the third row P13-P43, and the fourth row P14-P44. In FIGS. 6-8, the same reference numerals as those shown in FIG. 5 designate corresponding components.

Why the illustrative embodiment is capable of updating tap coefficients correctly will be described. The RLS algorithm is primarily designed to work correctly so long as phase fluctuations including frequency offset are absent, thereby removing intersymbol interference. It follows that proving that the tap updating algorithm of the tap coefficient control section 18 included in the embodiment is equivalent to the algorithm under the above condition will show that the tap coefficients are updated correctly.

Assume that detection and decision outputs under the condition free from phase fluctuations are R1, R2, D3 and D4, and that the phase control unit 17 is following phase fluctuations accurately. Then, detection outputs and decision outputs under a condition effected by phase fluctuations are expressed as $R1*e(j\phi)$, $R2*e(j\phi)$, $D3*e(j\phi)$, and $D4*e(j\phi)$. In this condition, the equation (2) may be modified as follows:

$$\begin{aligned}[Q] &= \{[P] * [\#R*e(-j\phi), \#D*e(-j\phi)]\}/ \\ &\quad \{\lambda + [R*e(j\phi), D*e(j\phi),]_t * [P] \\ &\quad * [\#R*e(j\phi), \#D*e(j\phi)] * [P]\} \\ &= \{[P] * [\#R, \#D]\} * e(-j\phi)/ \\ &\quad \{\lambda + [R, D]_t * [\#R, \#d]\}\end{aligned} \quad (4)$$

Substituting the equation (4) for the equation (1), there is obtained:

$$[C] = [C] + [\{[P] * [\#R, \#D]\} * e(-j\phi)/ \quad (5)$$
$$\{\lambda + [R, D]t * [\#R, \#D]\}] * E * e(j\phi)$$
$$= [C] + \{[P] * [\#R, \#D]\} * E/$$
$$\{\lambda + [R, D]t * [\#R, \#D]\}$$
$$= [C] + [q] * E$$

In the above equation (5), [q] is produced by:

$$[q] = [P]t * [\#R, \#D]/\{\lambda + [R,D]t * [\#R, \#D]\} \quad (6)$$

By substituting the equation (4) for the equation (3), the following equation is given:

$$\lambda^*[P] = [P] - [\{[P] * [\#R, \#D]\} * e(-j\phi)/ \quad (7)$$
$$\{\lambda + [R, D]t * [P] * [\#R, \#D]\}]$$
$$* \{[R^*e(j\phi), D^*e(j\phi)]t * [P]\}$$
$$= [P] - [Q] * [R, D]t * [P]$$

Further, the input/output error E from the subtractor 24 of the deciding section 50 is produced by:

$$E = D2 - [R^*e(j\phi), D^*e(j\phi)]t * [C] * e(-j\phi) \quad (8)$$
$$= D2 - [R, D]t * [C]$$

The equations (5)–(8) are representative of the RLS algorithm under the condition free from phase fluctuations and prove that the tap coefficient control section 18 updates tap coefficients correctly by the same procedure as in the above-mentioned condition.

In summary, it will be seen that the present invention provides an automatic equalizer which rotates the phase of the input to a complex transversal filter located at the rear of a deciding section and feeds the result of phase rotation and decision to a tap coefficient control section. Hence, when the tap coefficient control section is implemented with the RLS algorithm and even when received data involves phase flutuations, the equalizer of the invention is capable of updating tap coefficients as correctly as with data free from phase fluctuations. It follows that the equalizer of the invention surely removes intersymbol interference and phase fluctuations even when the frequency characteristic on a transmission channel sharply changes, thereby regenerating an original signal faithfully.

While the present invention has been described with reference to the particular illustrative embodiment, it is not to be restricted by this embodiment but only by the appended claims. It is to be appreciated that those skilled in the art can change or modify the embodiment without departing from the scope and spirit of the present invention. For example, while the embodiment has been shown and described as dealing with QAM signals as received signals, it is similarly practicable with any other kind of signals such as PSK (Phase Shift Keying) signals. Further, the embodiment is applicable not only to a telephone line but also to any other type of wired or wireless data communication channel.

What is claimed is:

1. An automatic equalizer for a data transmission channel, comprising:

a feedforward filter for holding a received detected signal in a complex representation to thereby remove precursor of intersymbol interference included in said received signal;

a feedback filter for holding a feedback signal fed back from an output terminal to thereby remove postcursor of intersymbol interference included in said feedback signal;

adding means for adding an output of said feedforward filter and an output of said feedback filter to produce a sum;

first multiplying means for multiplying said sum from said adding means by a phase rotation opposite in phase to an amount of phase fluctuation included in said sum to thereby produce a product;

deciding means for comparing said product from said first multiplying means with a set of predetermined desired signals to output an estimated signal;

error detecting means for producing an error output representative of a difference between a signal input to said deciding means and data output from said deciding means;

phase control means for feeding to said first multiplying means a phase rotation opposite in phase to said received detected signal on the basis of said error output from said error detecting means;

conjugate computing means for computing a complex conjugate number of an output of said phase control means;

second multiplying means for multiplying said estimated signal from said deciding means by said complex conjugate number from said conjugate computing means and feeding the resulting product to said feedback filter;

third multiplying means for multiplying said error output from said error detecting means and said complex conjugate number from said complex conjugate computing means to output the result of multiplication as an equalization error output; and tap coefficient control means for sequentially updating tap coefficients of said feedforward filter and tap coefficients of said feedback filter in response to held outputs from said feedforward filter and said feedback filter and said equalization error output from said third multiplying means.

2. An equalizer in accordance with claim 1, wherein said feedforward filter and said feedback filter are each constructed into a complex transversal filter including a plurality of delaying means and a plurality of multiplying means for multiplying outputs of said plurality of delaying means by tap coefficients.

3. An equalizer in accordance with claim 1, wherein when a frequency characteristic on said data transmission channel undergoes a sharp change, said tap coefficient control means updates the tap coefficients of said feedfoward filter and the tap coefficient of said feedback filter by an RLS (Recruves Least Square) algorithm.

4. An equalizer in accordance with claim 3, wherein said tap coefficient control means comprises:

a weighting coefficient updating section for updating initial weighting coefficients on receiving held outputs from said feedforward filter and said feedback filter;

a weight computing section for computing weights of the tap coefficients on receiving the outputs of said coefficient updating section and sampled outputs of said feedforward filter and said feedback filter; and a tap coefficient updating section for updating the tap coefficients on receiving the outputs of said weight computing section and the equalization error output of said third multiplying means.

5. An equalizer in accordance with claim 4, wherein said weighting coefficient updating section and said tap coefficient updating section each comprises a register for rewritably storing the associated coefficients.

6. An equalizer in accordance with claim 4, wherein said weight computing section comprises conjugate computing means for computing complex conjugate numbers of the sampled outputs of said feedforward filter and said feedback filter.

* * * * *